(12) United States Patent
Shanbhogue et al.

(10) Patent No.: US 9,652,388 B2
(45) Date of Patent: May 16, 2017

(54) METHOD, APPARATUS AND SYSTEM FOR PERFORMING MANAGEMENT COMPONENT TRANSPORT PROTOCOL (MCTP) COMMUNICATIONS WITH A UNIVERSAL SERIAL BUS (USB) DEVICE

(71) Applicant: Intel Corporation, Santa Clara, CA (US)

(72) Inventors: Vedvyas Shanbhogue, Austin, TX (US); Arvind Kumar, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 153 days.

(21) Appl. No.: 14/126,915

(22) PCT Filed: Jul. 31, 2013

(86) PCT No.: PCT/US2013/052936
§ 371 (c)(1),
(2) Date: Dec. 17, 2013

(87) PCT Pub. No.: WO2015/016882
PCT Pub. Date: Feb. 5, 2015

(65) Prior Publication Data
US 2015/0169453 A1 Jun. 18, 2015

(51) Int. Cl.
*G06F 13/28* (2006.01)
*G06F 12/0811* (2016.01)
(Continued)

(52) U.S. Cl.
CPC ........ *G06F 12/0811* (2013.01); *G06F 12/084* (2013.01); *G06F 12/0808* (2013.01);
(Continued)

(58) Field of Classification Search
CPC ............. G06F 12/0811; G06F 13/4027; G06F 12/084; G06F 12/0808; G06F 12/128;
(Continued)

(56) References Cited

U.S. PATENT DOCUMENTS 8,904,079 B2 * 12/2014 Chang .................... G06F 13/20
710/313
9,077,761 B2 * 7/2015 Nelogal .............. G06F 13/4282
(Continued)

OTHER PUBLICATIONS

"Management Component Transport Protocol (MCTP)" by Tom Slaight, DMTF Dec. 2007.*
(Continued)

*Primary Examiner* — Jing-Yih Shyu
(74) *Attorney, Agent, or Firm* — Trop, Pruner & Hu, P.C.

(57) ABSTRACT

In an embodiment, a host controller is configured to control communication with a plurality of universal serial bus (USB) devices, and to couple to a management controller and a host processor. The host controller includes a filter logic to filter information from a management control transmission protocol (MCTP) endpoint of a first USB device from being communicated to the host processor and to provide the MCTP endpoint information to the management controller. Other embodiments are described and claimed.

27 Claims, 12 Drawing Sheets

(51) Int. Cl.
*G06F 12/0808* (2016.01)
*G06F 12/084* (2016.01)
*G06F 12/128* (2016.01)
*G11C 7/10* (2006.01)
*G06F 13/40* (2006.01)

(52) U.S. Cl.
CPC ........ *G06F 12/128* (2013.01); *G06F 13/4027* (2013.01); *G11C 7/1072* (2013.01); *G06F 2212/284* (2013.01); *G06F 2212/305* (2013.01); *G06F 2212/69* (2013.01)

(58) Field of Classification Search
CPC ............... G06F 13/42; G06F 2212/305; G06F 2212/69; G06F 2212/284; G11C 7/1072
See application file for complete search history.

(56) References Cited

U.S. PATENT DOCUMENTS

| | | | |
|---|---|---|---|
| 2009/0083760 A1* | 3/2009 | Slaight | G06F 13/4022 719/313 |
| 2009/0172240 A1* | 7/2009 | Slaight | G06F 13/4022 710/313 |
| 2011/0138082 A1* | 6/2011 | Khatri | G06F 13/24 710/8 |
| 2012/0047309 A1* | 2/2012 | Natu | H04L 63/101 710/314 |
| 2012/0246372 A1 | 9/2012 | Chang et al. | |
| 2013/0124768 A1 | 5/2013 | Khatri et al. | |
| 2013/0173838 A1* | 7/2013 | Hsu | G06F 13/4027 710/315 |
| 2014/0281106 A1* | 9/2014 | Saghi | G06F 13/385 710/313 |

OTHER PUBLICATIONS

"Management Component Transport Protocol (MCTP) Base Specification" DSP0236 DMTF, Apr. 22, 2010.*
"Management Component Transport Protocol (MCTP) Host Interface Specification", DSP0256 DMTF, Jul. 21, 2010.*
"Management Component Transport Protocol (MCTP) PCIe VDM Transport .Binding Specification", DSP0238 DMTF, Dec. 11, 2009.*
International Searching Authority, "Notification of Transmittal of the International Search Report and the Written Opinion of the International Searching Authority," mailed Apr. 16, 2014, in International application No. PCT/US2013/052936.

* cited by examiner

METHOD, APPARATUS AND SYSTEM FOR PERFORMING MANAGEMENT COMPONENT TRANSPORT PROTOCOL (MCTP) COMMUNICATIONS WITH A UNIVERSAL SERIAL BUS (USB) DEVICE

TECHNICAL FIELD

This disclosure pertains to computing systems, and in particular to management communications within a system.

DETAILED DESCRIPTION

Figure 1:
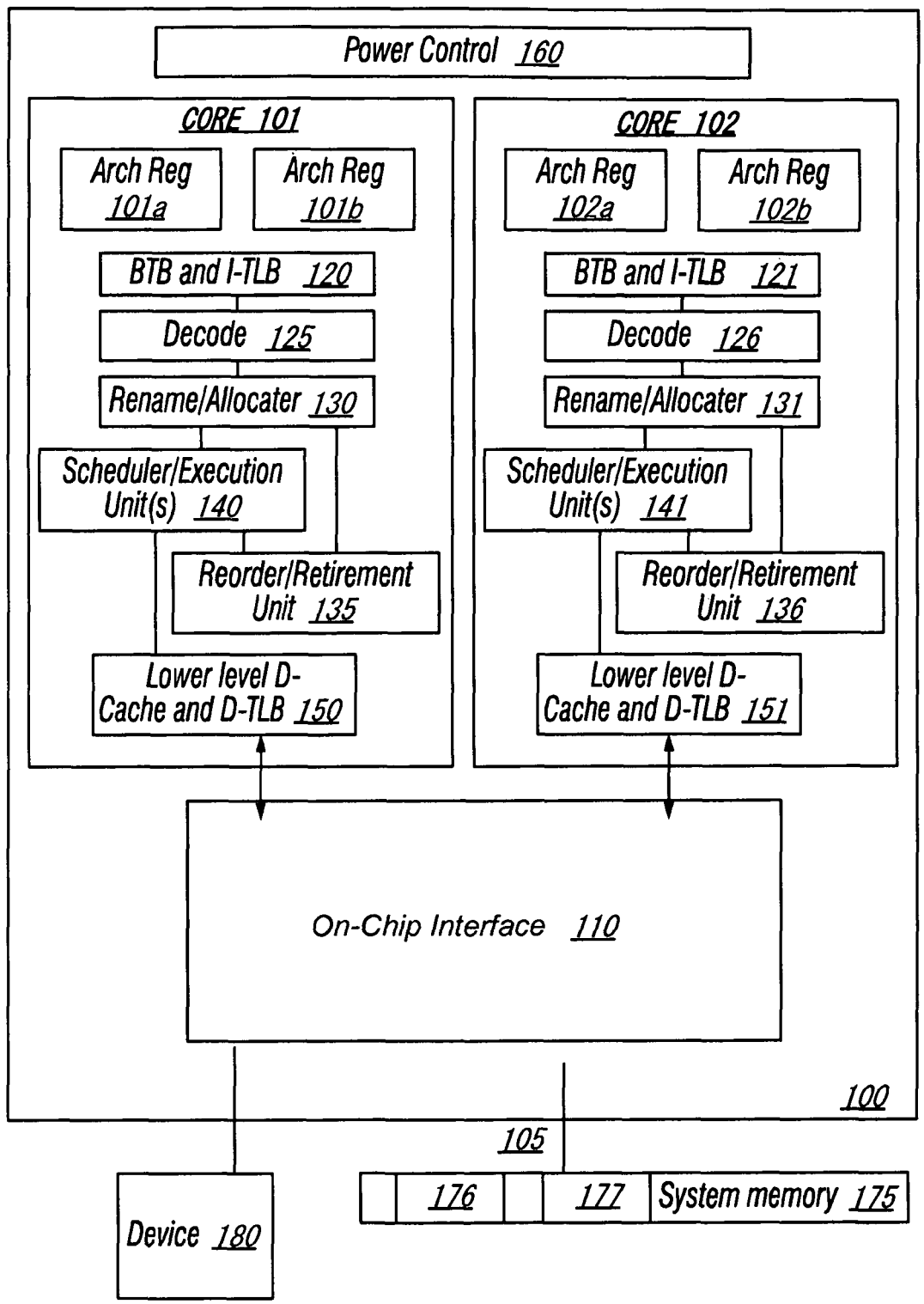
FIG. 1 illustrates an embodiment of a block diagram for a computing system including a multicore processor.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ITLB 120, load/store buffers, and queues may be shared through partitioning. Other resources, such as general purpose internal registers, page-table base register(s), low-level data-cache and data-TLB 150, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to branch target buffer and I-TLB 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 125, in one embodiment, recognize the same ISA (or a subset thereof). Alternatively, in a heterogeneous core environment, decoders 125 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 110 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 101 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, power controller 160, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back-end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

A management controller is a common component in many computer systems, especially server computers. The Distributed Management Task Force (DMTF) has defined a protocol to be communicated over a Peripheral Component Interconnect Express (PCIe™) link called the Management Component Transport Protocol (MCTP). This protocol facilitates communication between two or more management controllers in a platform, and between a management controller and managed devices in the platform.

A second protocol defined by the DMTF is the Network Controller Sideband Interface (NC-SI) that defines the payload and commands of the communication protocol carried using MCTP to a NC-SI/MCTP-capable network controller to enable sideband networking to the management controller. These protocols, MCTP and NC-SI, are used to establish a sideband connection to network controllers. But a management controller is not compatible with devices that communicate according to other protocols.

In various embodiments, to support communication between management controllers and universal serial bus (USB) devices, a technique is used to sequester selected USB endpoints and tunnel USB packets to and from these USB endpoints using PCIe™ vendor defined messages (VDMs). Further, MCTP messages may be mapped over a USB protocol to provide an end-to-end MCTP protocol between a MCTP-enabled endpoint in a USB device and a management controller. While different message formats and encapsulations may be used to achieve this functionality, for purposes of explanation, an example format is described herein.

The USB specification does not provide an equivalent of MCTP, and further does not provide support for MCTP. The USB host controller that manages USB devices is typically a PCIe™ device and, according to embodiments herein, also may be configured to be MCTP capable, at least in that it may be able to communicate MCTP packets embedded within USB packets. In this way MCTP may be used to tunnel USB packets from a management controller to a USB device endpoint through the USB host controller.

In various embodiments, the management controller may be a standalone component such as an integrated circuit (IC) or an integrated component of another IC such as a processor, e.g., an SoC. Management communications such as sideband communications including management signals, control and status signals and so forth, may be communicated via, one or more tunneled communications of another protocol such as a PCIe™ communication and/or tunneling of MCTP data within a USB communication. Embodiments may further provide for sequestering one or more endpoints of a USB device (or an entire USB device) (at least temporarily and possibly permanently) from a host processor such as the SoC to enable private communications between the endpoint and the management controller to remain hidden from the host processor.

To effect all of this functionality, VDMs may be generated and communicated in a downstream direction from the management controller to the endpoint and vice versa. These VDM messages may include various information including tunneling information to identify actions to be performed on the VDM message. In addition, a data flow protocol is provided to enable desired communications between management controller and endpoint.

Figure 2:
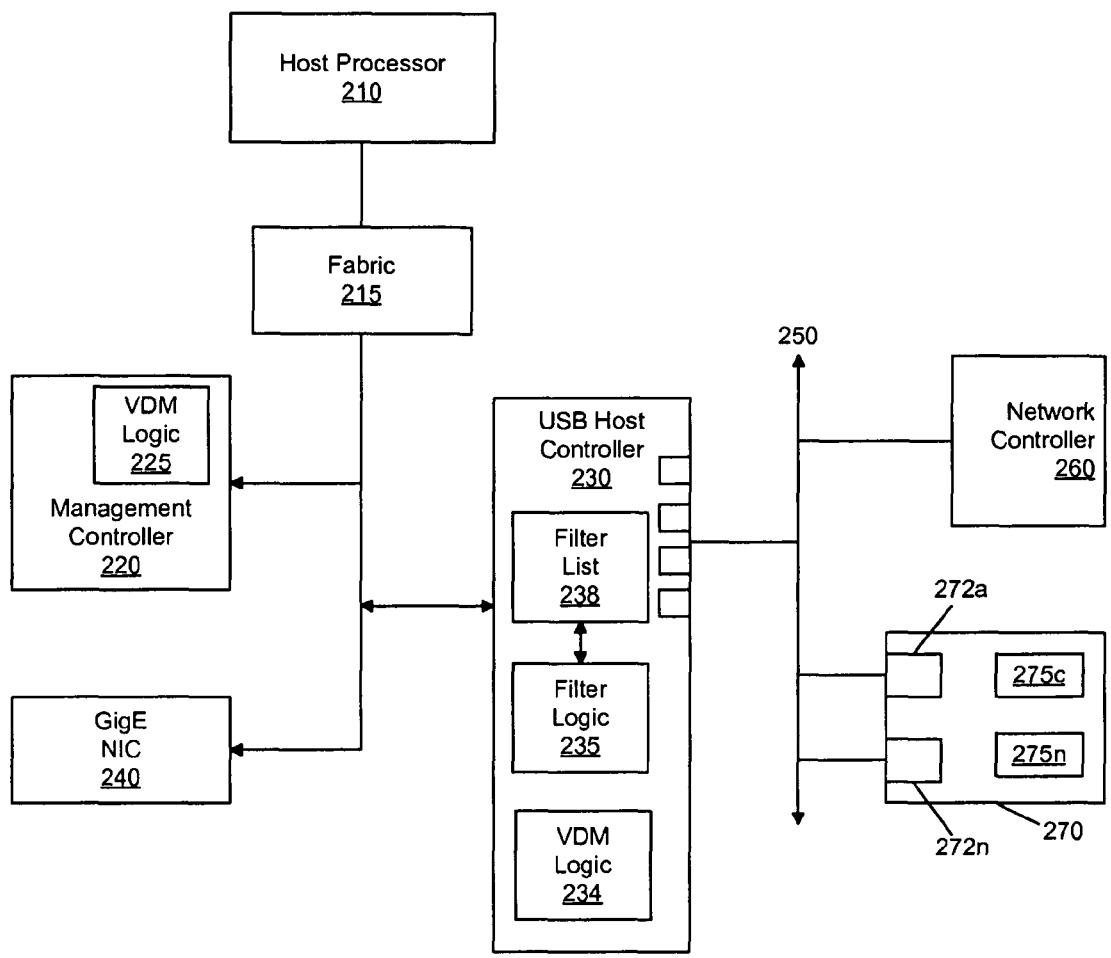
FIG. 2 is a block diagram of a system in accordance with an embodiment of the present invention.

Referring now to FIG. 2, shown is a block diagram of a system in accordance with an embodiment of the present invention. As shown in FIG. 2, system 200 may be any type of computing device, e.g., ranging from a server computer to a portable computing device such as a smartphone, tablet computer, Ultrabook™ computer or so forth. As seen, system 200 includes a host processor 210, which in various embodiments may be a multicore processor or other type of SoC. Understand that such SoC may include many different components and functionality, as described above. Host processor 210 communicates with additional circuits of the system via a fabric 215 which in an embodiment may provide a communication protocol for coupling host processor 210 to other components of the system via coherent and non-coherent interconnects as appropriate.

As an example component, system 200 includes a management controller 220. In the embodiment of FIG. 2, management controller (MC) 220 includes a VDM logic 225, details of which will be described further below. In general, management controller 220 may perform management control activities for the system including monitoring status of various sensors of the system such as environmental sensors, e.g., thermal and other sensors, performing management communications via remote communication paths, e.g., via a gigabit Ethernet network interface controller (NIC) 240 and others.

Still referring to FIG. 2, a USB host controller 230 is a hub device to enable various USB devices to be coupled into the system. Note that such devices may be permanently affixed within the system or be capable of easy installation and removal from the system such as familiar thumb drives, USB mouses, keyboards and so forth. In the specific embodiment shown in FIG. 2, USB host controller 230 includes a filter logic 235. Filter logic 235 may be used to sequester or hide one or more USB devices (and/or endpoints therein) from a host operating system (OS) executing on host processor 210, while enabling such hidden devices to be accessible to management controller 220. To aid in such filtering of devices and/or endpoints from the host processor, filter logic 235 may in communication with a filter list 238 coupled to the logic. As will be described further below, this filter list may be populated based on information received from the management controller to identify a set of devices and/or endpoints to be controlled to remain hidden from the host OS, at least for the duration of inclusion on this filter list.

As further seen in FIG. 2, host controller 230 further includes a corresponding VDM logic 234 which may be configured to receive incoming VDMs from management controller 220 and decode the information in the headers, including the USB tunnel VDM header to identify the type of tunnel message and to take appropriate action such as described below with regard to the data flows of FIGS. 3 and 4. Although shown as including separate logic, understand that host controller 230 may have generally include hardware, software, firmware and communications thereof, generally referred to as logic, to enable handling and communication of MCTP-based information between management controller 220 and certain endpoints within one or more USB devices.

Multiple USB devices may be coupled to USB host controller 230 via a USB bus 250. In the embodiment shown, the USB devices include a network controller 260, which may be a wireless interface, e.g., for a 3G or 4G wireless network, and a multi-function USB device 270. As one such example, multi-function device 270 may be a combined keyboard/mouse controller including multiple logical devices 275a-275n. Each of these devices may couple to a corresponding port 272a-272n. Although shown at this high level in the embodiment of FIG. 2, understand the scope of the present invention is not limited in this regard.

With reference back to management controller 220, in an embodiment USB tunneling over PCIe™ VDM may be performed via use of a VDM generator/receive logic 225 of the management controller. In an embodiment, this VDM is called a "USB tunnel VDM" and is used to interact with the USB host controller. This interaction may be implemented in several manners. In one manner, the communication may be via USB packets encapsulated within this VDM when a target endpoint in a USB device is not compatible with MCTP (or even where the device is MCTP capable). In another manner when a target endpoint is MCTP compatible, VDM logic 225 may generate a MCTP packet that itself is encapsulated within a USB packet that in turn is encapsulated into the VDM.

Figure 3:
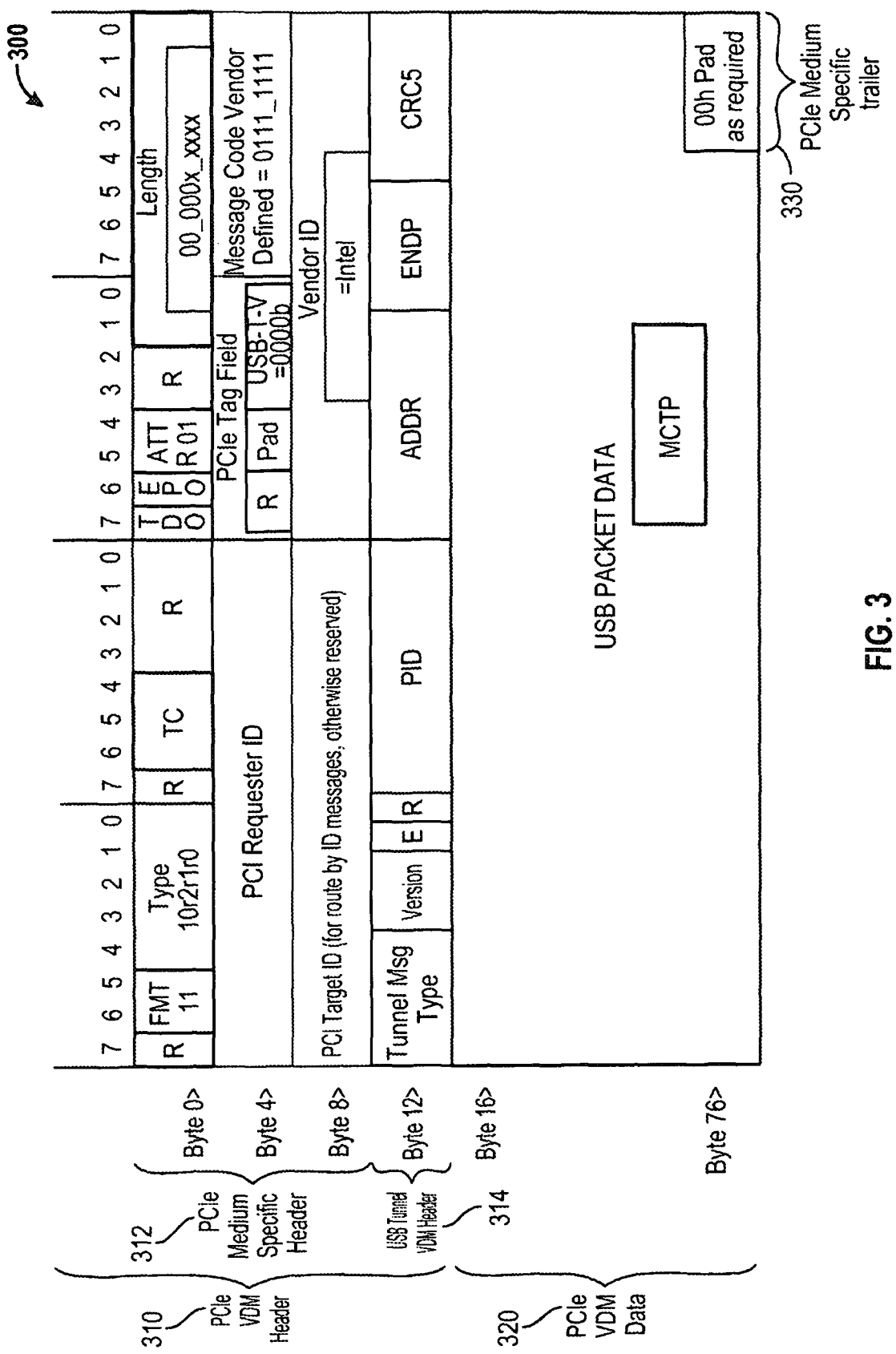
FIG. 3 is a block diagram of a vendor defined message packet in accordance with an embodiment of the present invention.

The structure of a VDM in accordance with one embodiment of the present invention is as shown in FIG. 3. As seen in FIG. 3, a packet 300 enables tunneling of USB packet data (which itself may include an encapsulated MCTP packet)

over a PCIe™ link. In the embodiment of FIG. 3, packet 300 includes a PCIe™ VDM header 310 and a PCIe™ VDM data portion 320. Packet header 310 includes a PCIe™ medium specific header 312 and a USB tunnel VDM header 314. In general, PCIe™ medium specific header 312 includes the conventional PCIe™ header information and USB tunnel VDM header 314 includes tunnel-specific information to be used for purposes of USB communication. Specifically this USB tunnel VDM header 314 includes a tunnel message type which indicates the type of VDM being generated. Example VDM types are described further below. Additional information to enable identification of the header version, a type of token to be generated, and addressing information is also present in USB tunnel VDM header 314.

In the embodiment of FIG. 3, the fields of the VDM are defined as in Table 1 below.

TABLE 1

| Field | Description |
|---|---|
| Fmt | Format (2 bits). Set to 11b to indicate 4 dword headers with data |
| Type | Type and Routing (5 bits). [4:3] Set to 10b to indicate a message [2:0] PCI message routing (r2r1r0) 000b: Route to Root Complex 010b: Route by ID Other routing fields values are not supported for this VDM type |
| TC | Traffic Class (3 bits). |
| TD | TPL Digest (1 bit). Set to 0b |
| EP | Error Present (1 bit). Set to 0 |
| Attr | Attributes (2 bits). Set to 01 |
| Length | Length: Length of the data in dwords - legal values can be between 1-16 [1 byte to 64 bytes] |
| PCI Requester ID | Bus/device/function number of the endpoint sending the message |
| Pad Len | Pad Length (2-bits). 1-based count (0 to 3) of the number of 0x00 pad bytes that have been added to the end of the packet to make the packet dword aligned with respect to PCIe ™. |
| VDM Code | Value that uniquely differentiates USB Tunnel VDM from other Intel VDMs. |
| Message Code | (8 bits). Set to 0111_1111b to indicate a Type 1 VDM |
| PCI Target ID | (16 bits). For Route By ID messages, this is the bus/device/function number that is the physical address of the target endpoint. This field is ignored for Route to Root Complex messages. |
| Vendor ID | (16 bits). Set to 32902 (0x8086) for Intel VDMs. The most significant byte is in byte 10, the least significant byte is byte 11. |
| R | PCIe ™ reserved bits. Refer to the PCI Express specification (PCIe ™) |
| Tunnel Msg Type | Indicates the type of VDM being generated |
| Version | [3:2]: Version of the header 00b - base version |
| E | [1:1]: USB Token Type 0 - Generate 3B token 1 - Generate extended 6B token |
| PID | Packet ID [7:4]: PID - see USB specifications [3:0]: Ones complement of the PID value in [7:4] |
| ADDR | [7:1]: USB device address |
| ENDP | USB endpoint ID (most significant bit in byte 14 and remaining bits in byte 15) |
| CRC5 | CRC5 (5 bit). [4:0] CRC5 over the PID, ADDR and ENDP fields |

In turn, the "tunnel message type" field of the VDM specifies the action to be performed on the VDM, and includes multiple types of actions to be performed based on the encoding, as shown in Table 2.

TABLE 2

| Encoding | VDM Type | Direction | Description |
|---|---|---|---|
| 00 | USB_TUNNEL_OUT_REQUEST | MC -> USB-Host Controller | To request USB host controller to initiate a OUT/DATA0 transaction over the USB bus to the specified USB endpoint |
| 01 | USB_TUNNEL_IN_REQUEST | MC -> USB-Host Controller | To request USB host controller to initiate a IN transaction over the USB bus to the specified USB endpoint |
| 02 | USB_TUNNEL_DATA_NOTIFY | USB-Host Controller -> MC | To notify MC about DATA0 packet received in response an IN token |
| 03 | USB_TUNNEL_HANDSHAKE | USB-Host Controller -> MC | To return the handshake code from device to the MC for an IN/OUT transaction |
| 04 | USB_TUNNEL_NOTIFY_SETUP | USB-Host Controller -> MC | To send a copy of SETUP message to MC |
| 05 | USB_TUNNEL_POLL_REQUEST | MC -> USB-Host Controller | To setup the list of MCTP endpoints to poll for data transfer to the management controller. The USB host controller initiates an IN/DATA0 transaction to each of these endpoints once every micro-frame. |
| 06 | USB_TUNNEL_FILTER_REQUEST | MC -> USB-Host Controller | To setup a filter list in the USB-HC. The filter is in the form of an ADDR + ENDP form. Specifying ADDR + 0 |

TABLE 2-continued

| Encoding | VDM Type | Direction | Description |
| --- | --- | --- | --- |
| | | | indicates all endpoints of that device are filtered out. |

In an embodiment, on receiving a USB_TUNNEL_OUT_REQUEST, the USB host controller extracts the PID, ADDR and ENDP from the USB tunnel VDM header and generates a 3B or 6B token (depending on the E bit) with specified PID, ADDR and ENDP for communication to the directed endpoint. Following communication of the token, the USB host controller generates a DATA0 packet using the PCIe™ VDM payload. A handshake packet communicated from the device is tunneled back to the management controller as a USB_TUNNEL_HANDSHAKE VDM.

Figure 4:
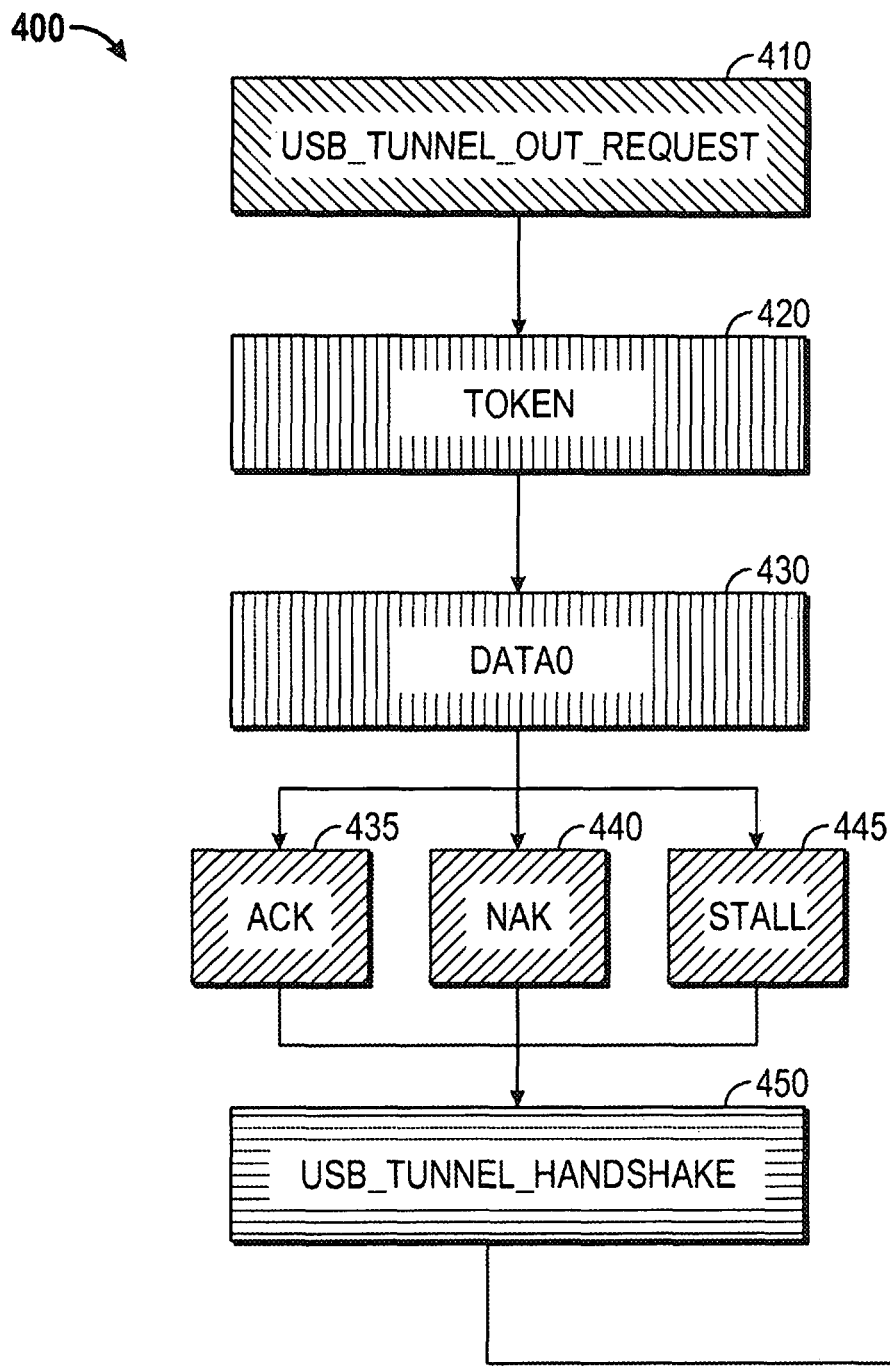
FIG. 4 is a flow diagram of a communication method in accordance with an embodiment of the present invention.

The data flow state machine for a downstream communication from management controller to host controller including data communicated from the management controller to the host controller is shown in FIG. 4. Examples of data communicated include network packets, contents of a file to be written to a thumb drive, etc. As seen in FIG. 4, a method 400 may be performed to provide data flow communications between the various components. Specifically, the data flow may be initiated by communication of a USB Tunnel Out request from the management controller to the host controller (block 410). Responsive to this request, the host controller generates and communicates a token to the appropriate device (block 420). This token is followed by data associated with the Tunnel Out request (block 430). The device may take one of three behaviors, sending an acknowledgement (ACK) (block 435), sending a no acknowledgement (NAK) (block 440), or sending a stall signal (block 445). In an embodiment, a NAK may occur if an endpoint buffer is full, e.g., due to previous data having not yet been processed. In an embodiment, a stall signal may be sent if the endpoint had an error and seeks to halt execution. Based on the type of response received from the device, a handshake tunnel message is sent from the host controller to the management controller (block 450) to notify the management controller regarding the status of the data delivery.

On receiving a USB_TUNNEL_IN_REQUEST, the USB host controller extracts the PID, ADDR and ENDP from the USB Tunnel VDM header and generates a 3B or 6B token (depending on E bit) with specified PID, ADDR and ENDP. The payload length for the USB_TUNNEL_IN_REQUEST is 0. If a NAK or STALL is received in response to the token, then a handshake packet is returned to the management controller as a handshake VDM (e.g., NAK when it has no data to send; STALL if it had an error). If a DATA0 packet is received, then a USB_TUNNEL_DATA_NOTIFY packet is returned to the MC.

Figure 5:
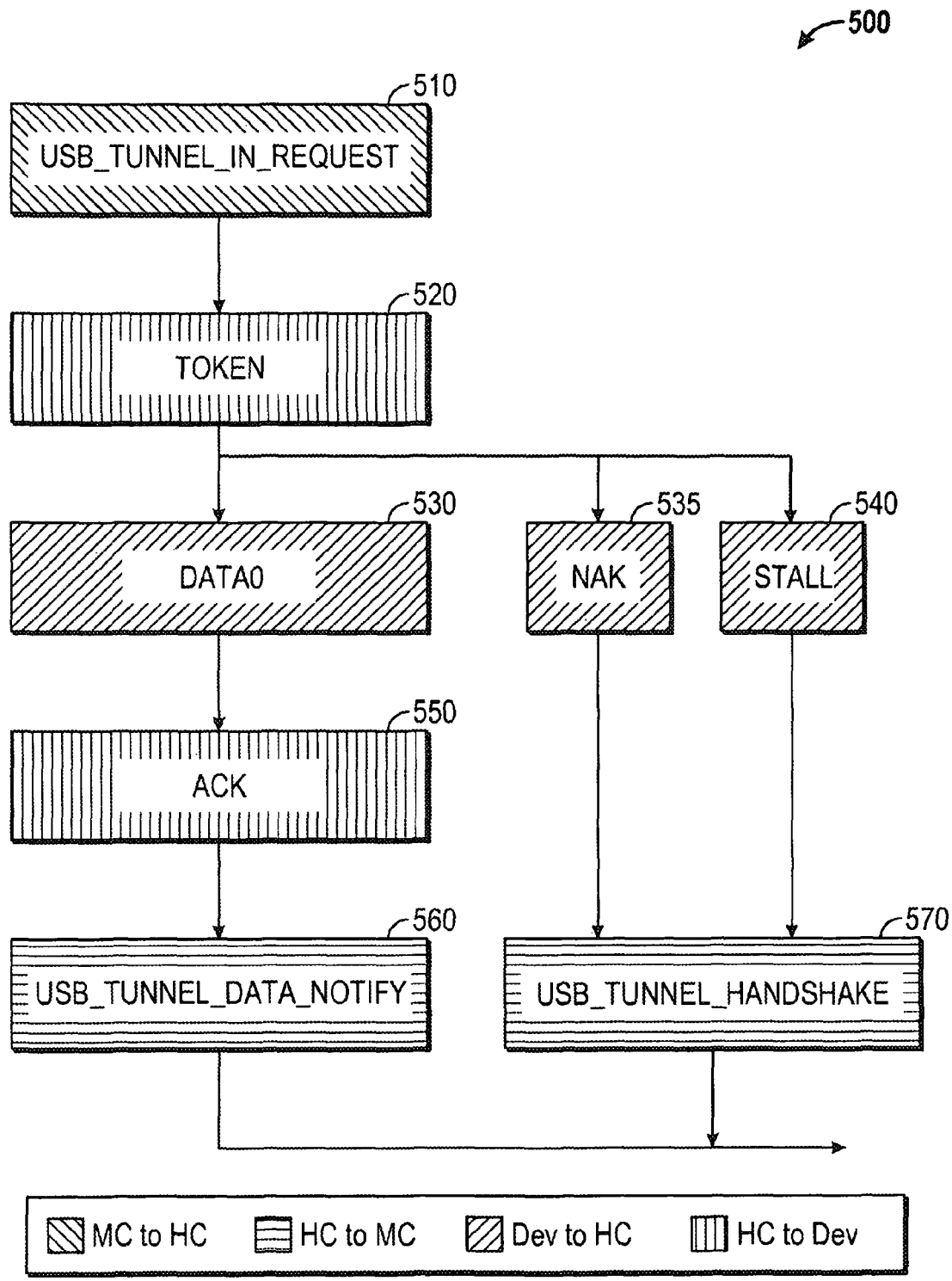
FIG. 5 is a flow diagram of a communication method in accordance with another embodiment of the present invention.

The data flow state machine for an upstream communication from management controller to host controller to request and receive data from an endpoint is shown in FIG. 5. As seen in FIG. 5, method 500 may be performed to provide data flow communications between the various components. Specifically, the data flow may be initiated by communication of a USB Tunnel IN request from the management controller to the host controller (block 510). Responsive to this request, the host controller generates and communicates a token to the appropriate device (block 520). Responsive to this token, the device in turn takes one of three behaviors, namely communication of data back to the host controller (block 530), sending of a NAK (block 535) or sending a stall signal (block 540). For either of a NAK or stall signal, control passes to block 570 where the host controller sends a USB tunnel handshake packet to the management controller. Instead when data is validly communicated, an ACK message is sent to the device (block 550), and the data is communicated to the management controller via a USB tunnel data NOTIFY packet (block 560).

The USB_TUNNEL_HANDSHAKE packet from the device is tunneled back to management controller using this VDM. The payload length is 0 and the PID indicates the handshake packet type, in an embodiment.

When the USB host controller generates a SETUP token, e.g., when a new USB device is inserted, it sends a copy of the SETUP token to the management controller using a USB_TUNNEL_NOTIFY_SETUP packet. This packet allows the management controller to learn when new device addresses are assigned. The payload of the VDM contains the bytes 0-7 of the SETUP message, in an embodiment.

A USB_TUNNEL_POLL_REQUEST VDM is used by the management controller to configure a list of address and endpoint numbers to generate IN type transactions according to a predetermined interval, e.g., once per micro-frame. In such embodiment, the VDM payload contains up to, e.g., 16 ADDR+ENDP pairs that are requested to be polled for interrupt transfers in a micro-frame. Responsive to this request, once for each micro-frame an IN type transaction is initiated using a 3B or 6B token (as specified in the E bit) for each of the configured endpoints. If a DATA0 packet is returned by the MCTP endpoint, it is tunneled back to the management controller in a USB_TUNNEL_DATA_NOTIFY message which includes this DATA0 packet. If a NAK or STALL is received, then no action is taken. In an embodiment, such polling may be performed in a portion of non-periodic bandwidth allocated on the bus.

A USB_TUNNEL_FILTER_REQUEST enables a management controller to perform functions such as temporary isolation of selected devices and endpoints in the device from access with a host processor (e.g., on which a user operating system/virtual machine monitor (OS/VMM) executes). A filter list is configured as a list of ADDR+ENDP pairs, in an embodiment. In an embodiment, this filter list may be stored in a storage of the host controller. If the ENDP is configured as a predetermined value (e.g., 0), it indicates that all endpoints in the device ADDR are filtered out.

The USB host controller suspends processing of pending I/O request packets (IRPs) submitted from the OS/VMM for the devices and/or endpoints in the filter list. In this case when an IRP transaction descriptor is picked up from a periodic or asynchronous schedule, if the ADDR and/or ENDP is filtered out then that IRP transaction descriptor is skipped and the USB host controller proceeds to the next transaction descriptor in the schedule. Note that IN/OUT transaction requests received over the USB tunnel VDM may be honored irrespective of the filter settings.

For MCTP binding to USB, USB packets may be carried using the PCIe™ VDM tunnel messages described above.

An endpoint is a uniquely identifiable portion of a USB device that is the terminus of a communication flow between the host and device. Each USB logical device is composed of a collection of independent endpoints. Each logical device has a unique address assigned by the system at device attachment time. In turn, each endpoint of a device is given at design time a unique device-determined identifier called the endpoint number. Each endpoint has a device-determined direction of data flow. The combination of the device address, endpoint number, and direction allows each endpoint to be uniquely referenced. Each endpoint is logic that provides a unidirectional connection that supports data flow in one direction: either input (from host controller to device) or output (from device to host controller). In an embodiment, a USB device that supports MCTP implements at least one pair of endpoints (MEP-IN and MEP-OUT) that are used to send (MEP-OUT) and receive (MEP-IN) MCTP packets between the management controller and the USB device. The endpoint number is same for both endpoints of this pair, in one embodiment.

Figure 6:
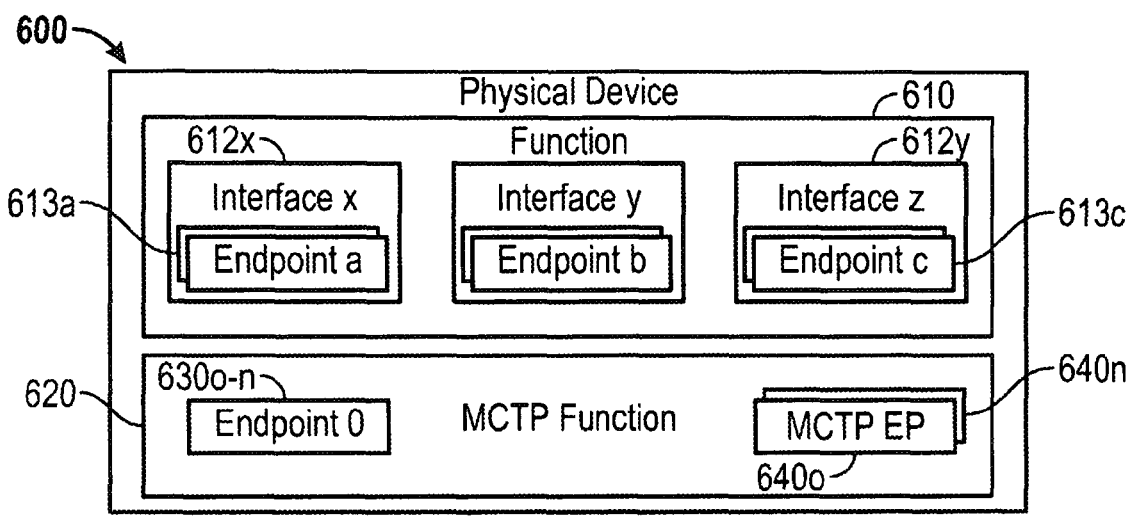
FIG. 6 is a block diagram of a USB device in accordance with an embodiment of the present invention.

Referring now to FIG. 6, shown is a block diagram of a USB device in accordance with an embodiment of the present invention. As shown in FIG. 6, device 600 may be any type of USB device, ranging from a storage device to a user interface device to any other device that may be configured to operate according to a USB specification. As seen, device 600 is a physical device that includes at least one logical sub-device or function 610. In turn function 610 includes a plurality of interfaces 612a-612c. Each of these interfaces may include multiple endpoints, namely endpoints 613a-613c. One of these functions is a MCTP function or logical device 620. In turn this logical device may include multiple endpoints $630_0$-$630_n$. In addition to these USB-based endpoints, at least a pair of MCTP endpoints $640_0$-$640_1$ are provided that may be configured to communicate according to an MCTP protocol such that MCTP packets can be communicated between a management controller and device 600. Note that although shown with these limited functions, logical devices and endpoints in FIG. 6, understand that in different implementations many more such functions, logical devices and endpoints may be present.

In an embodiment, a MCTP endpoint has the following characteristics: transfer type is interrupt; usage type is data endpoint; maximum packet size is 64B; number of transactions per micro-frame is 1; and interval for polling for data transfer is 1 per micro-frame.

In an embodiment, the data transfer is performed using the DATA0 packet format as defined in USB 2.0 specifications, and token packets use the extended PID format as specified in the USB 2.0 Link Power Management Specification.

Table 3 below shows an expanded token format for MCTP data transfer in accordance with an embodiment of the present invention.

TABLE 3

| 7 6 5 4 3 2 1 0 | 7 6 5 4 3 2 1 0 | 7 6 5 4 3 2 1 0 |
|---|---|---|
| PID = 0000 {EXT PID} | ADDR    ENDP | CRC5 |
| 7 6 5 4 3 2 1 0 | 7 6 5 4 3 2 1 0 | 7 6 5 4 3 2 1 0 |
| SubPID | ADDR    ENDP | CRC5 |

The Sub-PID types that identify MCTP tokens are as shown below in Table 4.

TABLE 4

| Sub Name | PID<3:0> | Description |
|---|---|---|
| N/A | 0000B | Reserved for future use |
| Reserved | 0001B | The PID values cannot be used for extended token packets |
|  | 1001B |  |
|  | 0101B |  |
|  | 1101B |  |
|  | 1000B |  |
|  | 0100B |  |
|  | 1100B |  |
| LPM | 0011B | LPM Token |
| MCTP-IN | 1011B | Token to transfer MCTP transport packet from function to host |
| MCTP-OUT | 0111B | Token to transfer MCTP transport packet from host to function |
|  | 1111B | Reserved for future use |
|  | 0010B |  |
|  | 1010B |  |
|  | 1110B |  |
|  | 0110B |  |

Note that the MCTP-IN and MCTP-OUT tokens may serve the same purpose as IN and OUT tokens for conventional endpoints.

Figure 7:
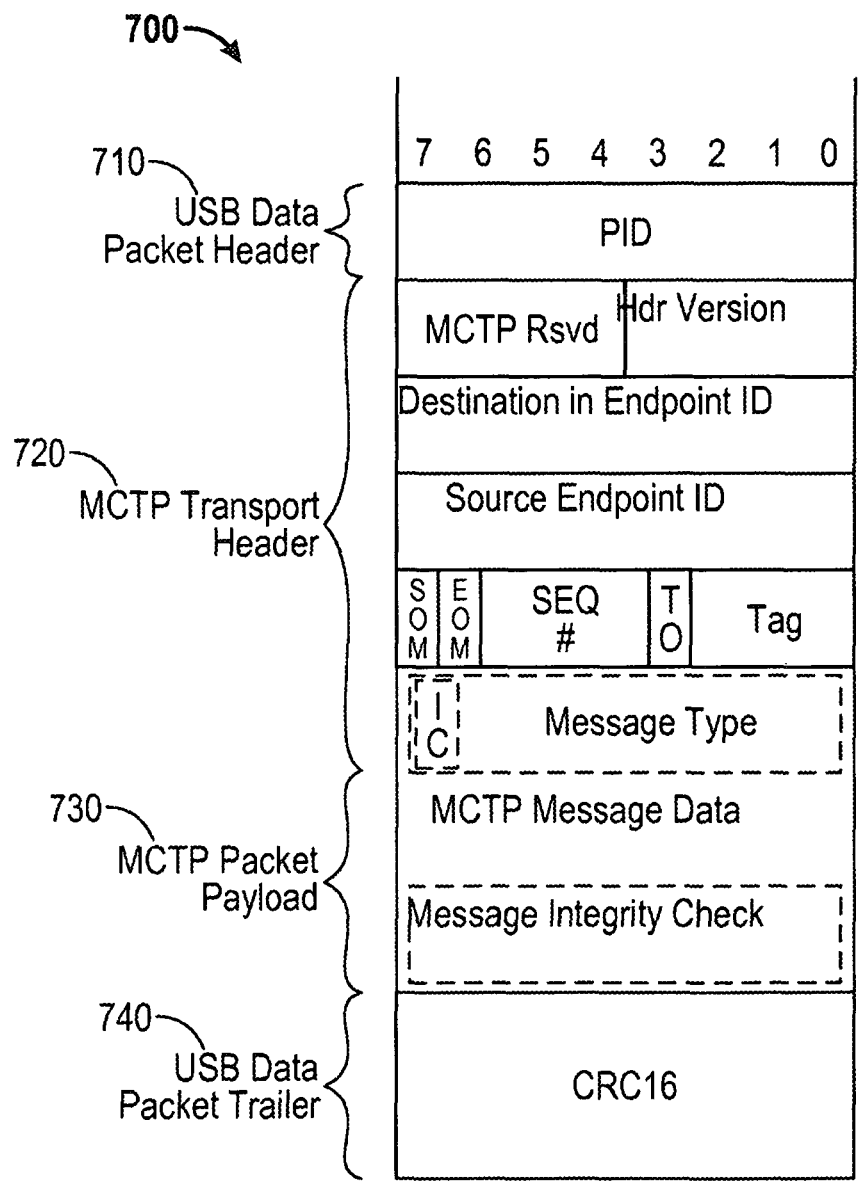
FIG. 7 is a block diagram of a USB packet including a MCTP packet encapsulated or tunneled therein.

Referring now to FIG. 7, shown is a block diagram of a USB packet including a MCTP packet encapsulated or tunneled therein in accordance with an embodiment of the present invention. As seen, packet 700 is a USB DATA0 packet including a USB data packet header 710 having a PID. The USB packet header is followed by a MCTP transport header 720, which is a header in accordance with the MCTP. This header is followed by an MCTP packet payload 730 that includes MCTP message data and a message integrity check, which in an embodiment may be implemented via a cyclic redundancy checksum (CRC). Finally, a USB data packet trailer 740 follows this packet payload field. In an embodiment, this trailer may include a CRC16 checksum.

Understand that this encapsulation of an MCTP packet into a USB packet is for purposes of communication between a management controller and an MCTP endpoint of a USB device. Instead in an implementation in which communication is between a management controller and a USB device lacking such MCTP endpoint, rather than MCTP encapsulation, MCTP-based data may be directly placed into a data payload portion of a USB packet. Also, such USB device may be filtered to take over the main functions by filtering them away from the OS. Also, note that while encapsulated into a USB packet in this embodiment, understand that different formats may occur in other embodiments. Furthermore, understand that while the MCTP packet is shown encapsulated into a USB packet, this USB packet itself can be encapsulated within a PCIe™ packet for communication between a USB host controller and a management controller via a PCIe™ link. And furthermore, other encapsulations according to different protocols may occur in other embodiments.

Note the MCTP endpoints are not described to client software executing on a host processor using endpoint descriptors. In an embodiment, the management controller can query the default control endpoint (0) to obtain the MCTP endpoint numbers using the following sequence: management controller sends MCTP-OUT token to default control endpoint; management controller sends a QUERY_MCTP_EP_REQUEST MCTP vendor defined message in a DATA0 packet to the default control endpoint; management controller sends a MCTP-IN token to the default control endpoint; and the default control endpoint responds with a DATA0 packet with the endpoint numbers for the MCTP endpoints.

The format of a QUERY_MCTP_EP_REQUEST MCTP vendor defined message according to an embodiment is as shown below in Table 5.

TABLE 5

| | Byte | Name | Description |
|---|---|---|---|
| Request Data | 1 | Vendor ID Format | 0x00 - PCI Vendor ID |
| | 2 | PCI Vendor ID | 0x8086 |
| | 4 | Request Type | 00 - QUERY_MCTP_EP_REQIEST |
| Response Data | 1 | Completion Code | 0x00- PCI Vendor ID |
| | 2 | MCTP EP Number | MCTP Endpoint Number |

The USB device default control endpoint responds to the MCTP messages even if no USB address assignment has been done yet. Receiving a NAK or timeout responsive to the MCTP_IN token to the default control endpoint indicates that the device does not support MCTP, and thus does not leverage the benefits of embodiments described herein.

USB is not a broadcast bus and thus the discovery protocol for USB is different than MCTP discovery carried out over a PCIe™ link. In an embodiment, discovery is triggered by the host controller when it notifies the management controller of a SETUP event. When a SETUP event is notified, the management controller determines whether the SETUP transaction is a SET_ADDRESS transaction, and if so queries the default control endpoint for the MCTP endpoint number of that device using the QUERY_MCTP_EP_REQUEST. At that point, the management controller generates an ENDPOINT_DISCOVERY MCTP message to that USB endpoint and proceeds with the MCTP endpoint assignment, e.g., as described in the MCTP specification DSP0236 from DMTF.

Figure 8:
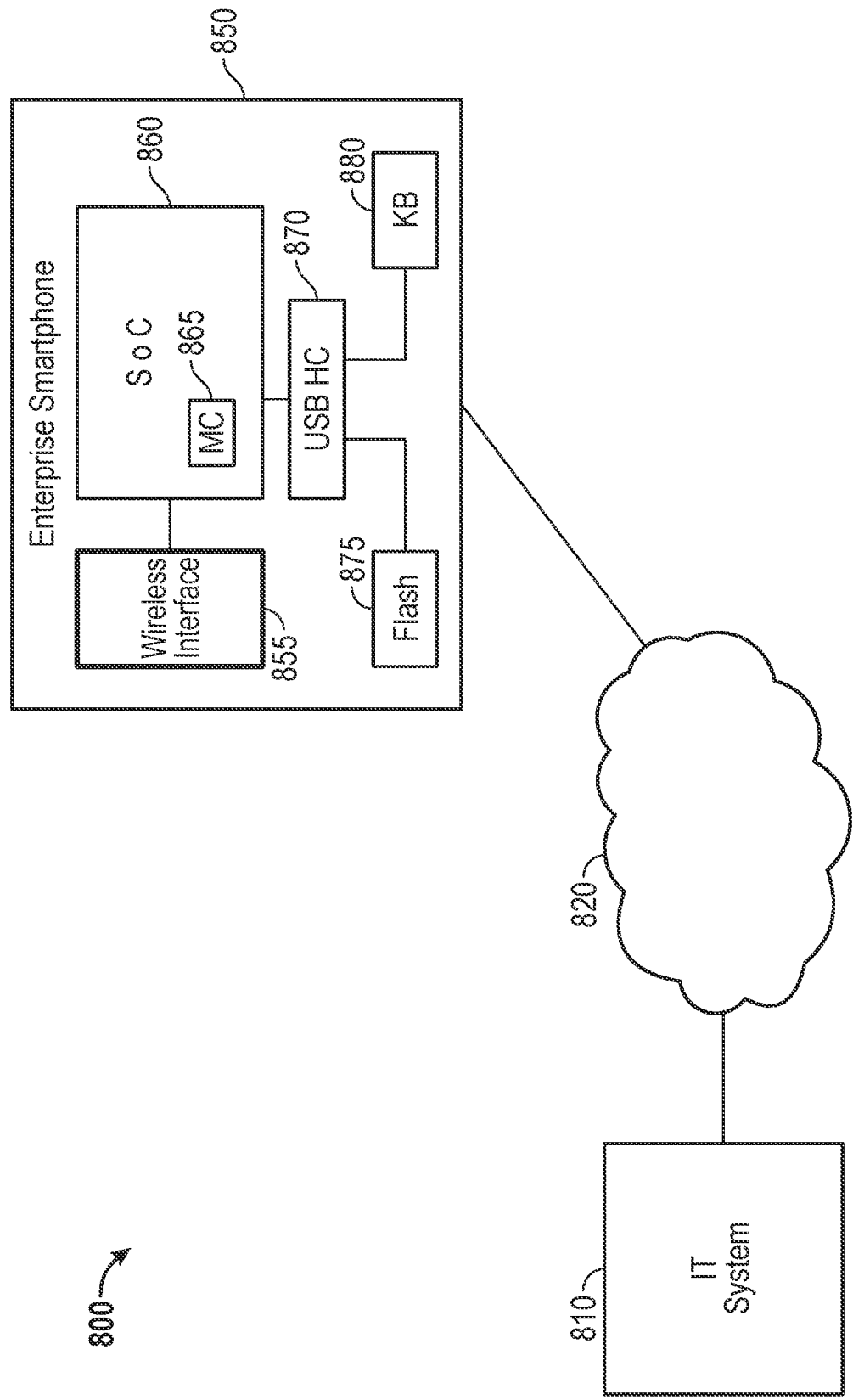
FIG. 8 is a block diagram of a network that interconnects various systems in accordance with an embodiment of the present invention.

Referring now to FIG. 8, shown is a block diagram of a network that interconnects various systems in accordance with an embodiment of the present invention. As shown in FIG. 8, a network 800 may be a wide area network implemented in part via an information technology (IT) system 810 of an enterprise. As an example, IT system 810 may be a client computer system or a server system that acts as an interface for IT personnel to provide services to a user such as a user of an enterprise smartphone 850, which may be a smartphone assigned to an employee of the enterprise. Of course understand that client systems may take other forms in different embodiments.

As seen, communications between IT system 810 and enterprise smartphone 850 may be via a cellular network 820, e.g., a given 3G or 4G wireless network. Of course understand that these devices may interconnect in other manners including via a local area network that can be wired or wireless, or via a wired wide area network as well. This is particularly so in instances when the client system is another type of computing device such as a client computer system, e.g., a desktop system.

In the embodiment of FIG. 8, smartphone 850 includes an SoC 860 such as described above. For purposes of discussion here SoC 860 includes a management controller 865 in accordance with an embodiment herein. This management controller can communicate MCTP messages with one or more USB devices via a USB host controller 870 according to the tunneling protocols described herein. Although shown as a separate component, understand that in certain implementations host controller 870 may be implemented within SoC 860.

Further details of smartphone 850 are shown in FIG. 8. Specifically additional components include a wireless interface 855 that enables communication via one or more wireless networks, including communicating packets via cellular network 820. For example, wireless interface 855 may accommodate multiple wireless protocols including cellular communications according to, e.g., a 3G or 4G standard, local area wireless protocols such as according to an Institute of Electrical and Electronics Engineers (IEEE) 802.11 protocol, a Bluetooth™ protocol or other protocols.

In addition, smartphone 850 further includes a non-volatile storage 875 which in the embodiment of FIG. 8 is implemented as a flash memory. This flash memory may be used for both mass storage as well as a system memory for the system during operation. In addition a keyboard controller 880 is coupled to host controller 870. Understand that while shown as connected in FIG. 8, it is possible for the wireless interface and other components to couple to the SoC via host controller 870.

By enabling communication between IT system 810 and smartphone 850, IT personnel can perform management operations on the smartphone. To this end, such communications may be made using logic within management controller 865 to enable the management operations to be performed in a manner hidden to other portions of SoC 860 such as one or more cores on which an operating system and other system software execute.

These management communications may be for purposes of performing diagnostics, maintenance operations or so forth. In addition, should smartphone 850 be stolen or otherwise compromised, IT personnel can initiate a wipe operation to cause all storage within the flash memory or other non-volatile storage of the system to be erased, thus preventing a malicious user from accessing enterprise data and any other information on the device. Further operations to prevent communications via the smartphone can also occur in this way.

Figure 9:
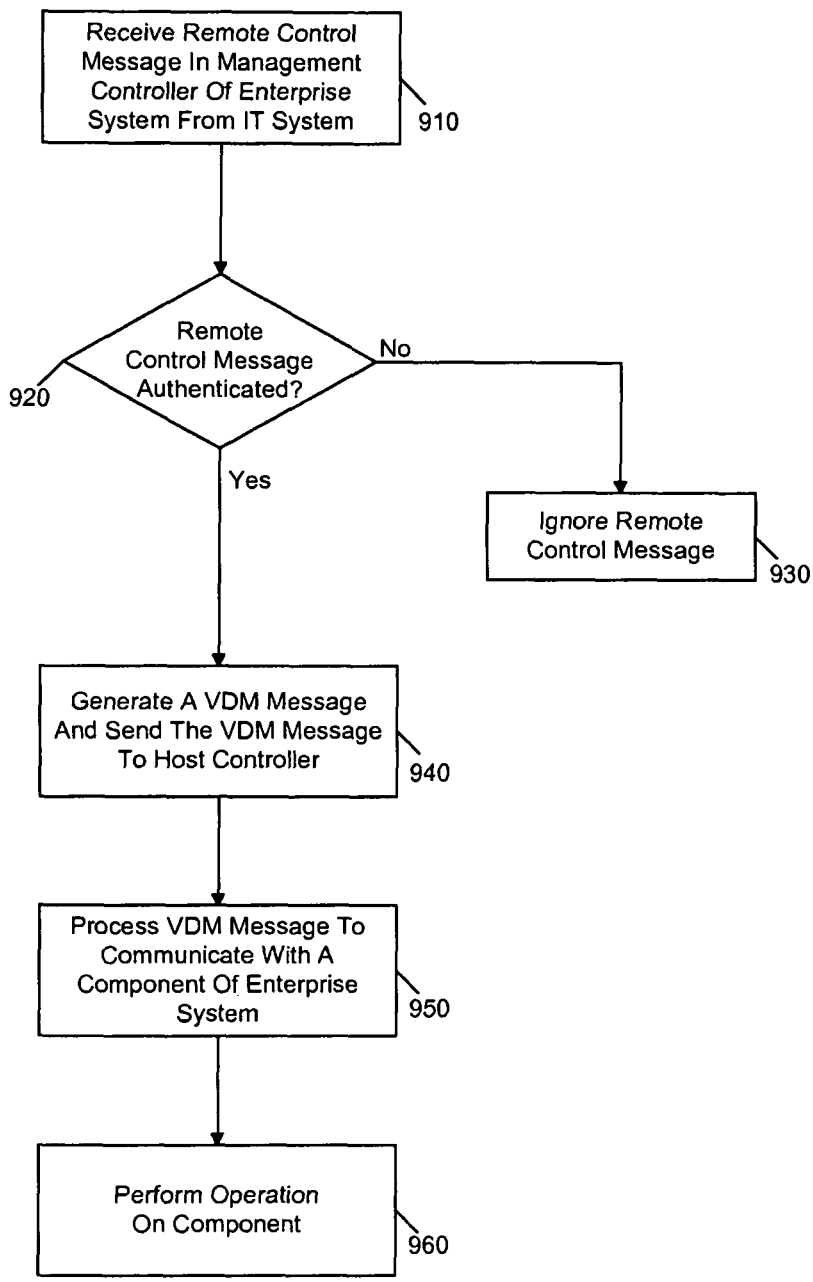
FIG. 9 is a flow diagram of a method for performing remote control operations on a client system in accordance with an embodiment of the present invention.

Referring now to FIG. 9, shown is a flow diagram of a method for performing remote control operations on a client system in accordance with an embodiment of the present invention. More specifically, method 900 may be used to perform remote control operations using a tunneled MCTP communication protocol in accordance with an embodiment of the present invention. As seen, method 900 may begin by receiving a remote control message in a management controller of an enterprise system from an IT system (block 910). For example with reference back to FIG. 8, assume that management controller 865 receives a remote control message initiated from IT system 810. While this remote control message may take many forms, the message may include an MCTP packet that requests performance of a remote control operation. These operations are diverse and can include many different types such as diagnostics, other testing, status requests and so forth. This communication may be via any given network and may be received within management controller 865 that may decode the message to determine the appropriate operations to be performed responsive to the message.

Initially however, the management controller may first determine whether this remote control message is authenticated (diamond 920). A selected one of various authentication protocols may be performed to determine the authenticity of the message. If it is determined that the message is not authentic, e.g., is received from a rogue source or is not an appropriate message, control passes to block 930 where the message may be ignored.

Still referring to FIG. 9, otherwise if the message is authenticated control passes to block 940 where a VDM message may be generated and sent to a host controller. In an embodiment, this VDM message may be generated according to the format shown above in FIG. 3. As an example, this VDM message may include commands regarding the remote control message received from the remote IT source. Next, control passes to block 950 where the recipient of this VDM message, namely the host controller, can process the VDM message to enable communication with a component of the enterprise system. In the context described herein, the USB host controller, may process the message by parsing it to extract a USB data portion and communicate it to the appropriate USB device based on the parsed information. Finally, control passes to block 960, where an operation can be performed on the component based on the information in the USB packet. As an example, this USB packet may include encapsulated information from the original MCTP message received from the remote IT source. Of course additional operations may occur within this method, including communication back, via the host controller, to the management controller, which in turn may cause additional communication between the management controller and the remote IT source.

Note that various operations may be performed on a component of the enterprise system responsive to this message. Assume in a first example that the remote control operation is to request diagnostics to be run on the SoC. Accordingly, the management controller may send a request to the SoC, flash memory, and/or other components of the smarphone for the performance of diagnostics and receive the results of the same and report the results back to the IT system.

As another example, assume that the remote control operation is a wipe command to cause the contents of a flash memory of the system to be erased. In this example, the management controller may initiate a wipe command via a sideband communication to the flash memory in a transparent manner to the SoC to cause the flash memory to be erased such that all of the information on the flash memory is prevented from further access, e.g., to a malicious user. Of course many other remote control operations are possible. As one example, a management controller may cause a USB keyboard to be sequestered from the host OS to enable the management controller to input a secure password from a message initiated by the remote IT personnel. In this way, the temporary sequestration of the keyboard device enables user input of this password to be sent to the remote IT personnel to allow the IT personnel to further access components of the system. Another example may be used to enable the local user to respond to a menu presented by the remote IT system.

One interconnect fabric architecture includes the Peripheral Component Interconnect (PCI) Express (PCIe™) architecture. A primary goal of PCIe™ is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Figure 10:
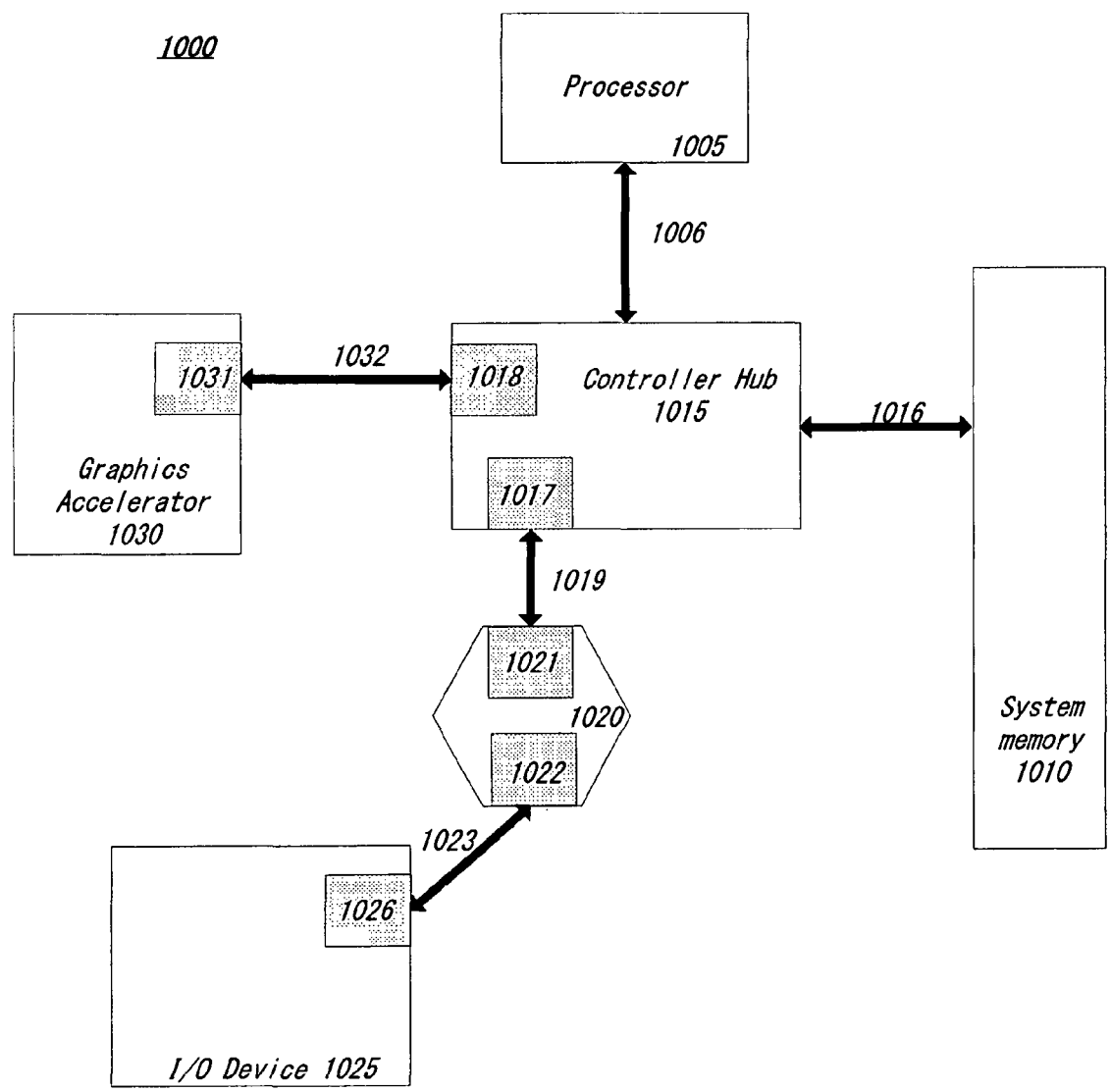
FIG. 10 illustrates an embodiment of an on-die interconnect.

Referring to FIG. 10, an embodiment of a fabric composed of point-to-point Links that interconnect a set of components is illustrated. System 1000 includes processor 1005 and system memory 1010 coupled to controller hub 1015. Processor 1005 includes any processing element, such as a microprocessor, a host processor, an embedded processor, a co-processor, or other processor. Processor 1005 is coupled to controller hub 1015 through front-side bus (FSB) 1006. In one embodiment, FSB 1006 is a serial point-to-point interconnect as described below. In another embodiment, link 1006 includes a serial, differential interconnect architecture that is compliant with different interconnect standard.

System memory 1010 includes any memory device, such as random access memory (RAM), non-volatile (NV) memory, or other memory accessible by devices in system 1000. System memory 1010 is coupled to controller hub 1015 through memory interface 1016. Examples of a memory interface include a double-data rate (DDR) memory interface, a dual-channel DDR memory interface, and a dynamic RAM (DRAM) memory interface.

In one embodiment, controller hub 1015 is a root hub, root complex, or root controller in a Peripheral Component Interconnect Express (PCIe or PCIE) interconnection hierarchy. Examples of controller hub 1015 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 1005, while controller 1015 is to communicate with I/O devices, in a similar manner as described below. In some embodiments, peer-to-peer routing is optionally supported through root complex 1015.

Here, controller hub 1015 is coupled to switch/bridge 1020 through serial link 1019. Input/output modules 1017 and 1021, which may also be referred to as interfaces/ports 1017 and 1021, include/implement a layered protocol stack to provide communication between controller hub 1015 and switch 1020. In one embodiment, multiple devices are capable of being coupled to switch 1020.

Switch/bridge 1020 routes packets/messages from device 1025 through link 1023 upstream, i.e. up a hierarchy towards a root complex, to controller hub 1015 and downstream, i.e. down a hierarchy away from a root controller, from processor 1005 or system memory 1010 to device 1025. Switch 1020, in one embodiment, is referred to as a logical assembly of multiple virtual PCI-to-PCI bridge devices. Device 1025 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe™ vernacular, such as device, is referred to as an endpoint. Although not specifically shown, device 1025 may include a PCIe™ to PCI/PCI-X bridge to support legacy or other version PCI devices. Endpoint devices in PCIe™ are often classified as legacy, PCIe™, or root complex integrated endpoints.

Graphics accelerator 1030 is also coupled to controller hub 1015 through serial link 1032. In one embodiment, graphics accelerator 1030 is coupled to an MCH, which is coupled to an ICH. Switch 1020, and accordingly I/O device 1025, is then coupled to the ICH. I/O modules 1031 and 1018 are also to implement a layered protocol stack to communicate between graphics accelerator 1030 and controller hub 1015. Similar to the MCH discussion above, a graphics controller or the graphics accelerator 1030 itself may be integrated in processor 1005.

Figure 11:
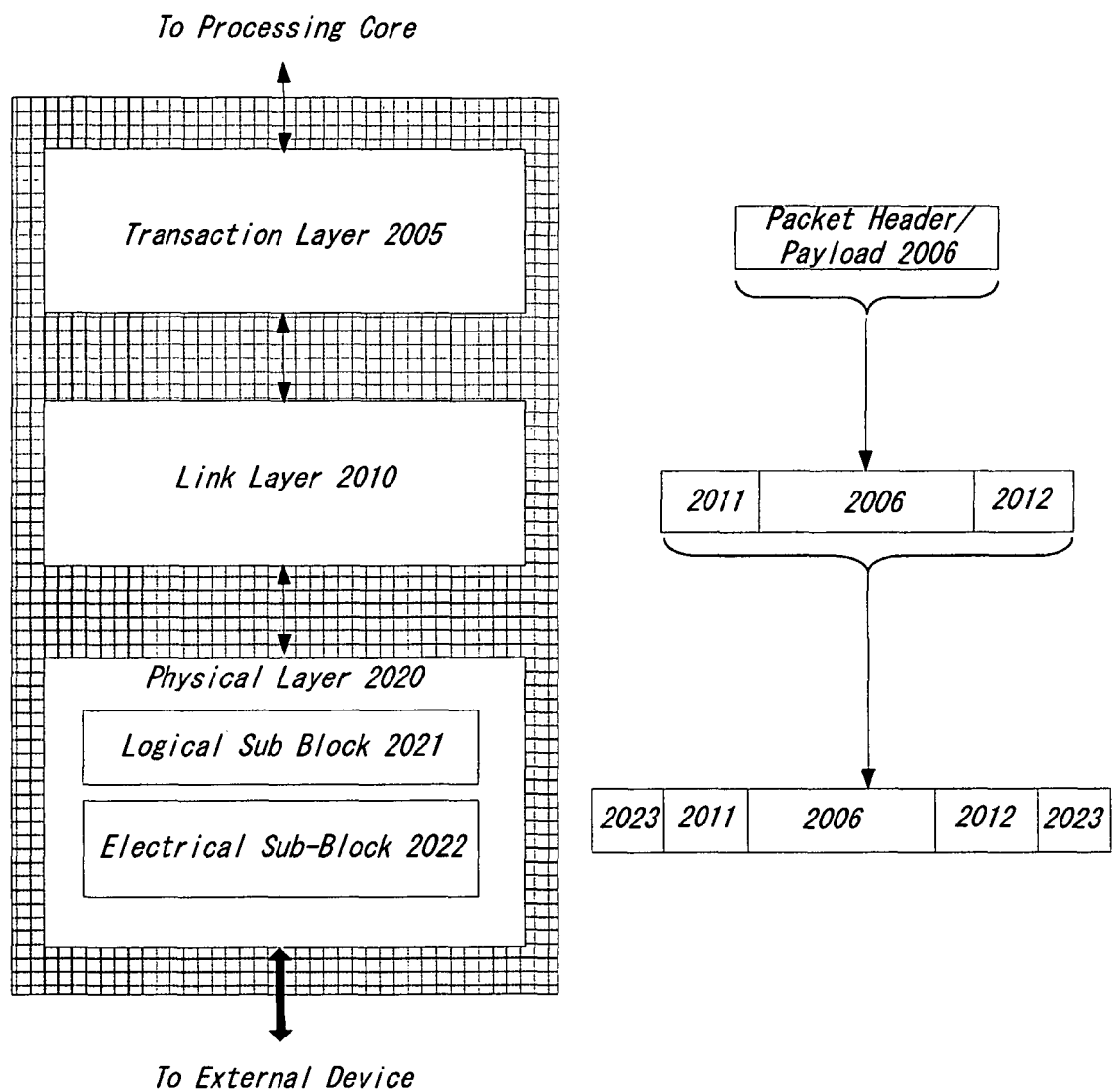
FIG. 11 illustrates another embodiment of an on-die interconnect.
Figure 12:
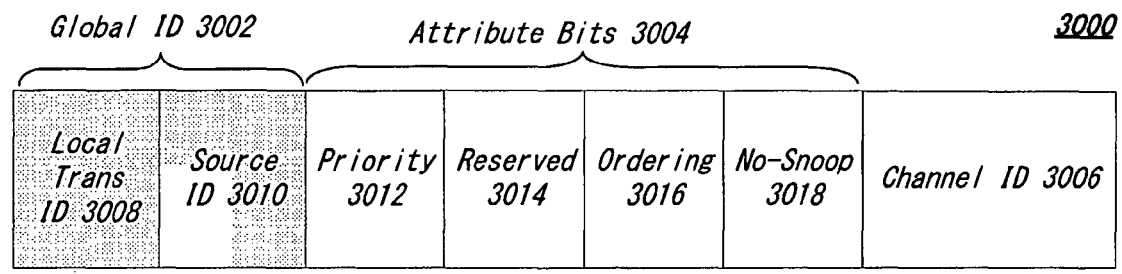
FIG. 12 illustrates an embodiment of a mesh interconnect fabric.
Figure 13:
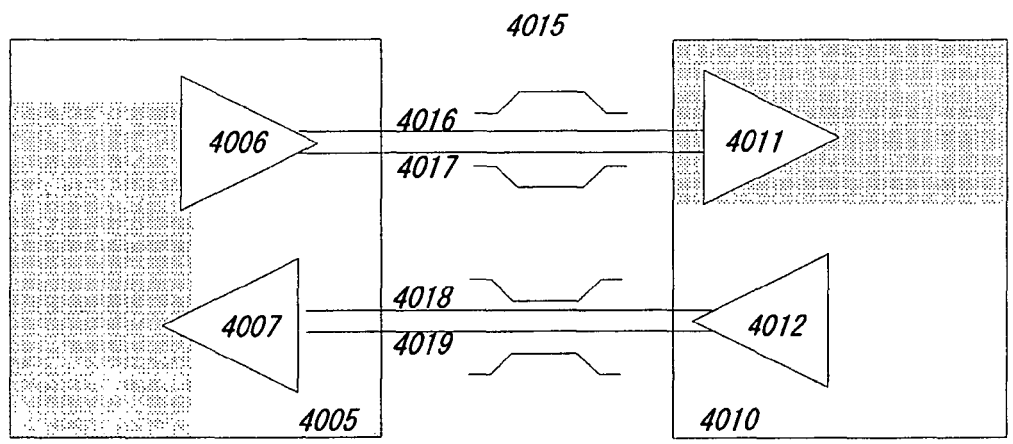
FIG. 13 illustrates another embodiment of a mesh interconnect fabric.

Turning to FIG. 11 an embodiment of a layered protocol stack is illustrated. Layered protocol stack 2000 includes any form of a layered communication stack, such as a Quick Path Interconnect (QPI) stack, a PCIe™ stack, a next generation high performance computing interconnect stack, or other layered stack. Although the discussion immediately below in reference to FIGS. 11-13 are in relation to a PCIe™ stack, the same concepts may be applied to other interconnect stacks. In one embodiment, protocol stack 2000 is a PCIe™ protocol stack including transaction layer 2005, link layer 2010, and physical layer 2020. An interface, such as interfaces 1017, 1018, 1021, 1022, 1026, and 1031 in FIG. 10, may be represented as communication protocol stack 2000. Representation as a communication protocol stack may also be referred to as a module or interface implementing/including a protocol stack.

PCI Express uses packets to communicate information between components. Packets are formed in the Transaction Layer 2005 and Data Link Layer 2010 to carry the information from the transmitting component to the receiving component. As the transmitted packets flow through the other layers, they are extended with additional information necessary to handle packets at those layers. At the receiving side the reverse process occurs and packets get transformed from their Physical Layer 2020 representation to the Data Link Layer 2010 representation and finally (for Transaction Layer Packets) to the form that can be processed by the Transaction Layer 2005 of the receiving device.

In one embodiment, transaction layer 2005 is to provide an interface between a device's processing core and the interconnect architecture, such as data link layer 2010 and physical layer 2020. In this regard, a primary responsibility of the transaction layer 2005 is the assembly and disassembly of packets (i.e., transaction layer packets, or TLPs). The transaction layer 2005 typically manages credit-base flow control for TLPs. PCIe™ implements split transactions, i.e. transactions with request and response separated by time, allowing a link to carry other traffic while the target device gathers data for the response.

In addition PCIe™ utilizes credit-based flow control. In this scheme, a device advertises an initial amount of credit for each of the receive buffers in Transaction Layer 2005. An external device at the opposite end of the link, such as controller hub 1015 in FIG. 10, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe™ devices. Transactions to the configuration space include read requests and write requests. Message space transactions (or, simply messages) are defined to support in-band communication between PCIe™ agents.

Therefore, in one embodiment, transaction layer 2005 assembles packet header/payload 2006. Format for current packet headers/payloads may be found in the PCIe™ specification at the PCIe™ specification website.

Quickly referring to FIG. 12, an embodiment of a PCIe™ transaction descriptor is illustrated. In one embodiment, transaction descriptor 3000 is a mechanism for carrying transaction information. In this regard, transaction descriptor 3000 supports identification of transactions in a system. Other potential uses include tracking modifications of default transaction ordering and association of transaction with channels.

Transaction descriptor 3000 includes global identifier field 3002, attributes field 3004 and channel identifier field 3006. In the illustrated example, global identifier field 3002 is depicted comprising local transaction identifier field 3008 and source identifier field 3010. In one embodiment, global transaction identifier 3002 is unique for all outstanding requests.

According to one implementation, local transaction identifier field 3008 is a field generated by a requesting agent, and it is unique for all outstanding requests that require a completion for that requesting agent. Furthermore, in this example, source identifier 3010 uniquely identifies the requestor agent within a PCIe™ hierarchy. Accordingly, together with source ID 3010, local transaction identifier 3008 field provides global identification of a transaction within a hierarchy domain.

Attributes field 3004 specifies characteristics and relationships of the transaction. In this regard, attributes field 3004 is potentially used to provide additional information that allows modification of the default handling of transactions. In one embodiment, attributes field 3004 includes priority field 3012, reserved field 3014, ordering field 3016, and no-snoop field 3018. Here, priority sub-field 3012 may be modified by an initiator to assign a priority to the transaction. Reserved attribute field 3014 is left reserved for future, or vendor-defined usage. Possible usage models using priority or security attributes may be implemented using the reserved attribute field.

In this example, ordering attribute field 3016 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 3018 is utilized to determine if transactions are snooped. As shown, channel ID Field 3006 identifies a channel that a transaction is associated with.

Link layer 2010, also referred to as data link layer 2010, acts as an intermediate stage between transaction layer 2005 and the physical layer 2020. In one embodiment, a responsibility of the data link layer 2010 is providing a reliable mechanism for exchanging Transaction Layer Packets (TLPs) between two components a link. One side of the Data Link Layer 2010 accepts TLPs assembled by the Transaction Layer 2005, applies packet sequence identifier 2011, i.e. an identification number or packet number, calculates and applies an error detection code, i.e. CRC 2012, and submits the modified TLPs to the Physical Layer 2020 for transmission across a physical to an external device.

In one embodiment, physical layer 2020 includes logical sub block 2021 and electrical sub-block 2022 to physically transmit a packet to an external device. Here, logical sub-block 2021 is responsible for the "digital" functions of Physical Layer 2021. In this regard, the logical sub-block includes a transmit section to prepare outgoing information for transmission by physical sub-block 2022, and a receiver section to identify and prepare received information before passing it to the Link Layer 2010.

Physical block 2022 includes a transmitter and a receiver. The transmitter is supplied by logical sub-block 2021 with symbols, which the transmitter serializes and transmits onto to an external device. The receiver is supplied with serialized symbols from an external device and transforms the received signals into a bit-stream. The bit-stream is de-serialized and supplied to logical sub-block 2021. In one embodiment, an 8b/10b transmission code is employed, where ten-bit symbols are transmitted/received. Here, special symbols are used to frame a packet with frames 2023. In addition, in one example, the receiver also provides a symbol clock recovered from the incoming serial stream.

As stated above, although transaction layer 2005, link layer 2010, and physical layer 2020 are discussed in reference to a specific embodiment of a PCIe™ protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Referring next to FIG. 13, an embodiment of a PCIe™ serial point to point fabric is illustrated. Although an embodiment of a PCIe™ serial point-to-point link is illustrated, a serial point-to-point link is not so limited, as it includes any transmission path for transmitting serial data. In the embodiment shown, a basic PCIe™ link includes two, low-voltage, differentially driven signal pairs: a transmit pair 4006/4011 and a receive pair 4012/4007. Accordingly, device 4005 includes transmission logic 4006 to transmit data to device 4010 and receiving logic 4007 to receive data from device 4010. In other words, two transmitting paths, i.e. paths 4016 and 4017, and two receiving paths, i.e. paths 4018 and 4019, are included in a PCIe™ link.

A transmission path refers to any path for transmitting data, such as a transmission line, a copper line, an optical line, a wireless communication channel, an infrared communication link, or other communication path. A connection between two devices, such as device 4005 and device 4010, is referred to as a link, such as link 4015. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 4016 and 4017, to transmit differential signals. As an example, when line 4016 toggles from a low voltage level to a high voltage level, i.e. a rising edge, line 4017 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

The following examples pertain to further embodiments.

In one example, an apparatus comprises a host controller to be coupled to a management controller configured to detect messages of a first message type and to be coupled to an endpoint device configured to detect messages of a second message type and messages of a third message type, the host controller to send a message of the second message type to the endpoint device, where the message of the second message type includes a message of the third message type received in the host controller from the management controller in a message of the first message type, the host controller including sequestration logic to sequester the endpoint device from a host processor. In one example, the host controller further includes a mapping logic to map messages of the first message type to messages of the second message type to provide an end-to-end protocol between the management controller and the endpoint device.

In an example, the host controller includes a first logic to receive a first tunnel request from the management controller, generate and send a token to the endpoint device responsive to the first tunnel request, send data received from the management controller to the endpoint device responsive to the first tunnel request, and to thereafter send a tunnel handshake packet to the management controller to indicate a status of the data.

In an example, the first logic is to receive a second tunnel request from the management controller, generate and send a second token to the endpoint device responsive to the second tunnel request, and send data received from the endpoint device to the management controller via a tunnel notification message.

In an example, the first logic is to receive a third tunnel request from the management controller including a list of endpoint devices to request a poll of the corresponding endpoint devices, where responsive to the third tunnel request the host controller is to initiate a data request to each of the endpoint devices during a communication frame.

In an example, the first logic is to send first data received from a first endpoint device in a first communication frame responsive to the data request to the management controller, where the first logic is to not send a message to the management controller responsive to receipt of a no acknowledgement message or a stall message from the first endpoint device responsive to the data request.

In an example, the first logic is to generate a setup token responsive to insertion of the endpoint device and to communicate the setup token to the management controller and the host processor, where the setup token is to be sent to the management controller with an identification of the endpoint device and the setup token is to be sent to the host processor without the endpoint device identification.

In an example, the first logic is to receive a filter request from the management controller for the endpoint device and responsive to the filter request to suspend processing of an input/output request packet (IRP) from the host processor for the endpoint device and to enable data to be sent between the endpoint device and the management controller responsive to a tunnel request from the management controller.

In an example, the host controller is to receive a MCTP packet of the third message type within a USB packet of the second message type communicated by the endpoint device and to communicate the USB packet to the management controller within a PCIe™ packet of the first message type.

In one example, an apparatus comprises a USB device including at least one logical device having an address, the at least one logical device including a plurality of endpoints each having an endpoint number and a flow direction, wherein the plurality of endpoints includes a first MCTP endpoint to send one or more MCTP packets embedded in a USB packet and a second MCTP endpoint to receive one or more MCTP packets embedded in a USB packet.

In an example, the USB device is coupled to a host controller, the host controller to communicate with a management controller coupled to the USB device via a PCIe™ protocol.

In an example, the first MCTP endpoint is to insert data into a first MCTP packet and to encapsulate the MCTP packet into a first USB packet, responsive to a request for the data received from the management controller.

In an example, the host controller is to encapsulate the first USB packet within a PCIe™ packet and send the PCIe™ packet to the management controller.

In an example, the host controller is to send first information regarding the plurality of endpoints except the first and second MCTP endpoints to a host processor, and to send second information regarding the first and second MCTP endpoints to the management controller, wherein the first and second MCTP endpoints are hidden from the host processor.

In an example, the host controller is to send the first information to the host processor responsive to a request from the host processor and to send the second information to the management controller responsive to a notify request from the management controller.

In one example, an apparatus comprises a management controller to perform management communications with a plurality of devices including a host controller, the host controller configured to communicate with a plurality of USB devices to couple to the host controller, the management controller including VDM logic to generate a VDM packet including encapsulated USB data for communication to at least one of the plurality of USB devices.

In an example, the encapsulated USB data includes a MCTP message for a first MCTP endpoint of a first USB device coupled to the host controller.

In an example, the management controller is to receive a communication from a remote system, and to generate the VDM packet to request the first MCTP endpoint of the first USB device to perform an action on the first USB device.

In an example, the first USB device comprises a flash memory and the action comprises a wipe of the flash memory.

In an example, the VDM packet comprises a PCIe™ packet, the management controller coupled to the host controller via a PCIe™ link.

In an example, the PCIe™ packet includes a PCIe™ VDM header having a PCIe™ header and a USB tunnel VDM header and a PCIe™ VDM data portion including a USB packet, wherein the USB packet includes a MCTP packet encapsulated therein.

In one example, a system comprises a host controller to communicate with a plurality of USB devices, and including a filter logic to filter information from a MCTP endpoint of a first USB device from being sent to a host processor and to send the MCTP endpoint information to a management controller, a USB device coupled to the host controller, the USB device including at least one logical device having a plurality of endpoints each having an endpoint number and a flow direction, where the plurality of endpoints includes a first MCTP endpoint to send one or more MCTP packets embedded in a USB packet and a second MCTP endpoint to receive one or more MCTP packets embedded in a USB packet, and a management controller coupled to the host controller, the management controller including VDM logic to generate a VDM packet including encapsulated USB data for communication to at least one of the plurality of USB devices.

In an example, the system further comprises a SoC coupled to the host controller, the SoC comprising a plurality of cores, a plurality of cache memories, a fabric interface to couple the plurality of cores to at least one peripheral device, and a power controller to control power consumption of the SoC.

In an example, the management controller is implemented in the SoC.

In an example, the system comprises a wireless communication device further including a non-volatile storage and a wireless interface.

Note that a processor such as the above SoC can be implemented using various means.

In an example, the processor comprises a SoC incorporated in a user equipment touch-enabled device.

In another example, a system comprises a display and a memory, and includes the processor of one or more of the above examples.

In an example, the management controller is to receive a message from a remote system, and to generate the VDM packet to request that the first MCTP endpoint perform an action on the first USB device, the first USB device comprising a flash memory and the action comprising a wipe of the flash memory.

In one example, a method comprises receiving a remote control message initiated from an IT system in a management controller of a client system, the management controller coupled to a host controller coupled to a plurality of USB devices, generating a VDM in the management controller responsive to the remote control message, the VDM including MCTP message for delivery to a first one of the plurality of USB devices, to cause the first USB device to perform an operation, and communicating the VDM to the host controller, where the host controller does not communicate according to MCTP.

In an example, the VDM includes a first tunnel request from the management controller, to cause the host controller to communicate a token to an MCTP endpoint of the first USB device and to thereafter communicate data received from the management controller to the MCTP endpoint.

In an example, the VDM includes a second tunnel request from the management controller, to cause the host controller to communicate a second token to the MCTP endpoint, to receive data from the MCTP endpoint, and to communicate the data to the management controller.

In an example, the method further comprises generating the VDM to request the MCTP endpoint to initiate a wipe operation to erase contents of a flash memory, where the MCTP endpoint, the VDM and the wipe operation are hidden from a host processor of the client system.

In another example, a computer readable medium including instructions is to perform the method of any of the above examples.

In another example, an apparatus comprises means for performing the method of any one of the above examples.

Understand that various combinations of the above examples are possible.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a host controller to be coupled to a management controller configured to detect messages of a first message type and an endpoint device configured to detect messages of a second message type and messages of a third message type, the host controller to send a message of the second message type to the endpoint device, wherein the message of the second message type includes a message of the third message type received in the host controller from the management controller, the message of the third message type including a message of the first message type, the host controller including sequestration logic to sequester the endpoint device from a host processor, wherein the host controller includes a first logic to receive a first tunnel request from the management controller, generate and send a token to the endpoint device responsive to the first tunnel request, send data received from the management controller to the endpoint device responsive to the first tunnel request, and to thereafter send a tunnel handshake packet to the management controller to indicate a status of the data.

2. The apparatus of claim 1, wherein the first logic is to receive a second tunnel request from the management controller, generate and send a second token to the endpoint device responsive to the second tunnel request, and send data received from the endpoint device to the management controller via a tunnel notification message.

3. The apparatus of claim 1, wherein the first logic is to receive a third tunnel request from the management controller including a list of endpoint devices to request a poll of the corresponding endpoint devices, wherein responsive to the third tunnel request the host controller is to initiate a data request to each of the endpoint devices during a communication frame.

4. The apparatus of claim 3, wherein the first logic is to send first data received from a first endpoint device in a first communication frame responsive to the data request to the management controller, wherein the first logic is to not send a message to the management controller responsive to receipt of a no acknowledgement message or a stall message from the first endpoint device responsive to the data request.

5. The apparatus of claim 1, wherein the first logic is to generate a setup token responsive to insertion of the endpoint device and to communicate the setup token to the management controller and the host processor, wherein the setup token is to be sent to the management controller with an identification of the endpoint device and the setup token is to be sent to the host processor without the endpoint device identification.

6. The apparatus of claim 1, wherein the first logic is to receive a filter request from the management controller for the endpoint device and responsive to the filter request to suspend processing of an input/output request packet (IRP) from the host processor for the endpoint device and to enable data to be sent between the endpoint device and the management controller responsive to a tunnel request from the management controller.

7. The apparatus of claim 1, wherein the host controller is to receive a Management Component Transport Protocol (MCTP) packet of the third message type within a universal serial bus (USB) packet of the second message type communicated by the endpoint device and to communicate the USB packet to the management controller within a Peripheral Component Interconnect Express (PCIe™) packet of the first message type.

8. An apparatus comprising:
a universal serial bus (USB) device including at least one logical device having an address, the at least one logical device including a plurality of endpoints each having an endpoint number and a flow direction, wherein the plurality of endpoints includes a first Management Component Transport Protocol (MCTP) endpoint to send one or more MCTP packets embedded in a USB packet and a second MCTP endpoint to receive one or more MCTP packets embedded in a USB packet.

9. The apparatus of claim 8, wherein the USB device is coupled to a host controller, the host controller to communicate with a management controller coupled to the USB device via a Peripheral Component Interconnect Express (PCIe™) protocol.

10. The apparatus of claim 9, wherein the first MCTP endpoint is to insert data into a first MCTP packet and to encapsulate the MCTP packet into a first USB packet, responsive to a request for the data received from the management controller.

11. The apparatus of claim 10, wherein the host controller is to encapsulate the first USB packet within a PCIe™ packet and send the PCIe™ packet to the management controller.

12. The apparatus of claim 9, wherein the host controller is to send first information regarding the plurality of endpoints except the first and second MCTP endpoints to a host processor, and to send second information regarding the first and second MCTP endpoints to the management controller, wherein the first and second MCTP endpoints are hidden from the host processor.

13. The apparatus of claim 12, wherein the host controller is to send the first information to the host processor responsive to a request from the host processor and to send the second information to the management controller responsive to a notify request from the management controller.

14. An apparatus comprising:
a management controller to perform management communications with a plurality of devices including a host controller, the host controller configured to communicate with a plurality of universal serial bus (USB) devices to couple to the host controller, the management controller including vendor defined message (VDM) logic to generate a VDM packet including encapsulated USB data in a USB packet, the USB packet encapsulated in the VDM packet for communication to at least one of the plurality of USB devices, wherein the management controller is to send a tunnel request to the host controller to cause the host controller to generate and send a token to the at least one USB device, and to thereafter send data to the host controller to cause the host controller to send the data to the at least one USB device and receive a tunnel handshake packet from the host controller to indicate a status of the data.

15. The apparatus of claim 14, wherein the encapsulated USB data includes a Management Component Transport Protocol (MCTP) message of a MCTP packet, the MCTP packet encapsulated in the USB packet, the MCTP message for a first MCTP endpoint of a first USB device coupled to the host controller.

16. The apparatus of claim 15, wherein the management controller is to receive a communication from a remote system, and to generate the VDM packet to request the first MCTP endpoint of the first USB device to perform an action on the first USB device.

17. The apparatus of claim 16, wherein the first USB device comprises a flash memory and the action comprises a wipe of the flash memory.

18. The apparatus of claim 14, wherein the VDM packet comprises a Peripheral Component Interconnect Express (PCIe™) packet, the management controller coupled to the host controller via a PCIe™ link.

19. The apparatus of claim 18, wherein the PCIe™ packet includes a PCIe™ VDM header having a PCIe™ header and a USB tunnel VDM header and a PCIe™ VDM data portion including the USB packet, wherein the USB packet includes the MCTP packet encapsulated therein.

20. A system comprising:
a host controller to communicate with a plurality of universal serial bus (USB) devices, and including a filter logic to filter information from a management control transmission protocol (MCTP) endpoint of a first USB device from being sent to a host processor and to send the MCTP endpoint information to a management controller;
a universal serial bus (USB) device coupled to the host controller, the USB device including at least one logical device having a plurality of endpoints each having an endpoint number and a flow direction, where the plurality of endpoints includes a first MCTP endpoint to send one or more MCTP packets embedded in a USB packet and a second MCTP endpoint to receive one or more MCTP packets embedded in a USB packet; and
a management controller coupled to the host controller, the management controller including vendor defined message (VDM) logic to generate a VDM packet including encapsulated USB data for communication to at least one of the plurality of USB devices.

21. The system of claim 20, further comprising a System on a Chip (SoC) coupled to the host controller, the SoC comprising:
a plurality of cores;
a plurality of cache memories;
a fabric interface to couple the plurality of cores to at least one peripheral device; and
a power controller to control power consumption of the SoC.

22. The system of claim 21, wherein the system comprises a wireless communication device further including a non-volatile storage and a wireless interface.

23. The system of claim 22, wherein the management controller is to receive a message from a remote system, and to generate the VDM packet to request that the first MCTP endpoint perform an action on the first USB device, the first USB device comprising a flash memory and the action comprising a wipe of the flash memory.

24. A method comprising:
receiving a remote control message initiated from an information technology (IT) system in a management controller of a client system, the management controller coupled to a host controller coupled to a plurality of universal serial bus (USB) devices;
generating a vendor defined message (VDM) in the management controller responsive to the remote control message, the VDM including a management control transport protocol (MCTP) message for delivery to a first one of the plurality of USB devices, to cause the first USB device to perform an operation; and
communicating the VDM to the host controller, wherein the host controller does not communicate according to MCTP.

25. The method of claim 24, wherein the VDM includes a first tunnel request from the management controller, to cause the host controller to communicate a token to an MCTP endpoint of the first USB device and to thereafter communicate data received from the management controller to the MCTP endpoint.

26. The method of claim 25, wherein the VDM includes a second tunnel request from the management controller, to cause the host controller to communicate a second token to the MCTP endpoint, to receive data from the MCTP endpoint, and to communicate the data to the management controller.

27. The method of claim 25, further comprising generating the VDM to request the MCTP endpoint to initiate a wipe operation to erase contents of a flash memory, wherein the MCTP endpoint, the VDM and the wipe operation are hidden from a host processor of the client system.

* * * * *